(12) United States Patent
Park

(10) Patent No.: US 9,401,193 B2
(45) Date of Patent: Jul. 26, 2016

(54) MEMORY DEVICE REFRESHING WORD LINE ACCESSED IN PREVIOUS WRITE OPERATION

(71) Applicant: SK hynix Inc., Gyeonggi-do (KR)

(72) Inventor: Mun-Phil Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/691,303

(22) Filed: Apr. 20, 2015

(65) Prior Publication Data

US 2016/0180904 A1 Jun. 23, 2016

(30) Foreign Application Priority Data

Dec. 19, 2014 (KR) .................. 10-2014-0184129

(51) Int. Cl.
*G11C 7/00* (2006.01)
*G11C 8/08* (2006.01)
*G11C 8/12* (2006.01)

(52) U.S. Cl.
CPC .. *G11C 8/08* (2013.01); *G11C 7/00* (2013.01); *G11C 8/12* (2013.01)

(58) Field of Classification Search
CPC .. G11C 7/22; G11C 11/4091; G11C 11/4094; G11C 29/26; G11C 8/12; G11C 8/18; G11C 16/10; G11C 7/06; G11C 7/08
USPC ......... 365/191, 189.011, 230.06, 189.05, 205
See application file for complete search history.

(56) References Cited

U.S. PATENT DOCUMENTS

| 2003/0101307 A1* | 5/2003 | Gemelli | G06F 17/5045 710/305 |
| 2004/0066700 A1* | 4/2004 | Lee | G11C 7/1021 365/232 |
| 2013/0201770 A1* | 8/2013 | Harris | G11C 5/025 365/189.011 |

FOREIGN PATENT DOCUMENTS

| KR | 1020030016530 | 3/2003 |
| KR | 100810040 | 3/2008 |

* cited by examiner

*Primary Examiner* — Gene Auduong
(74) *Attorney, Agent, or Firm* — IP & T Group LLP

(57) ABSTRACT

A memory device includes a memory bank including a plurality of word lines, and a word line controller capable of activating a first word line, which is accessed during a previous write operation, among the plurality of word lines, while activating a second word line corresponding to an input address among the plurality of word lines, during an active operation.

20 Claims, 12 Drawing Sheets

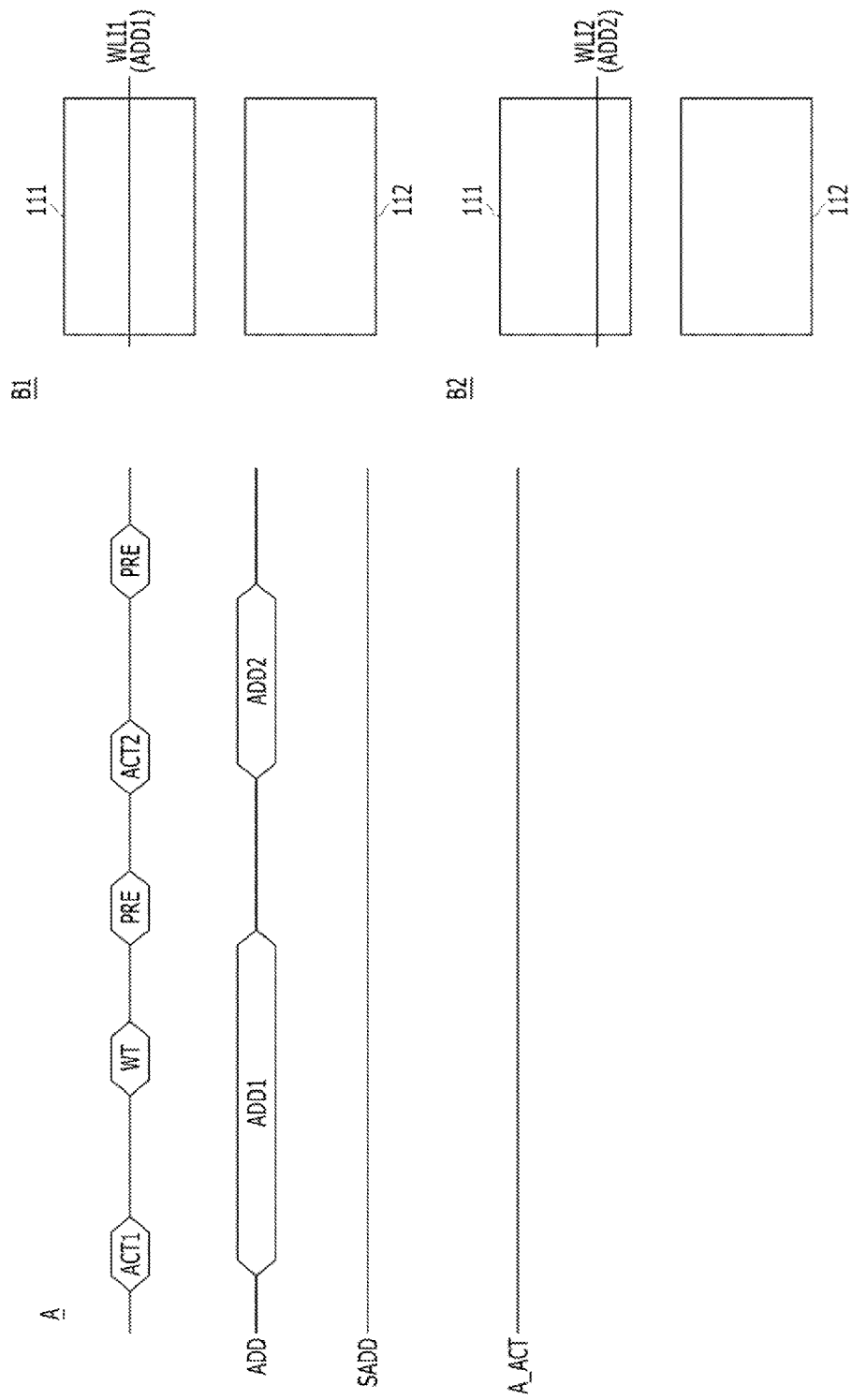

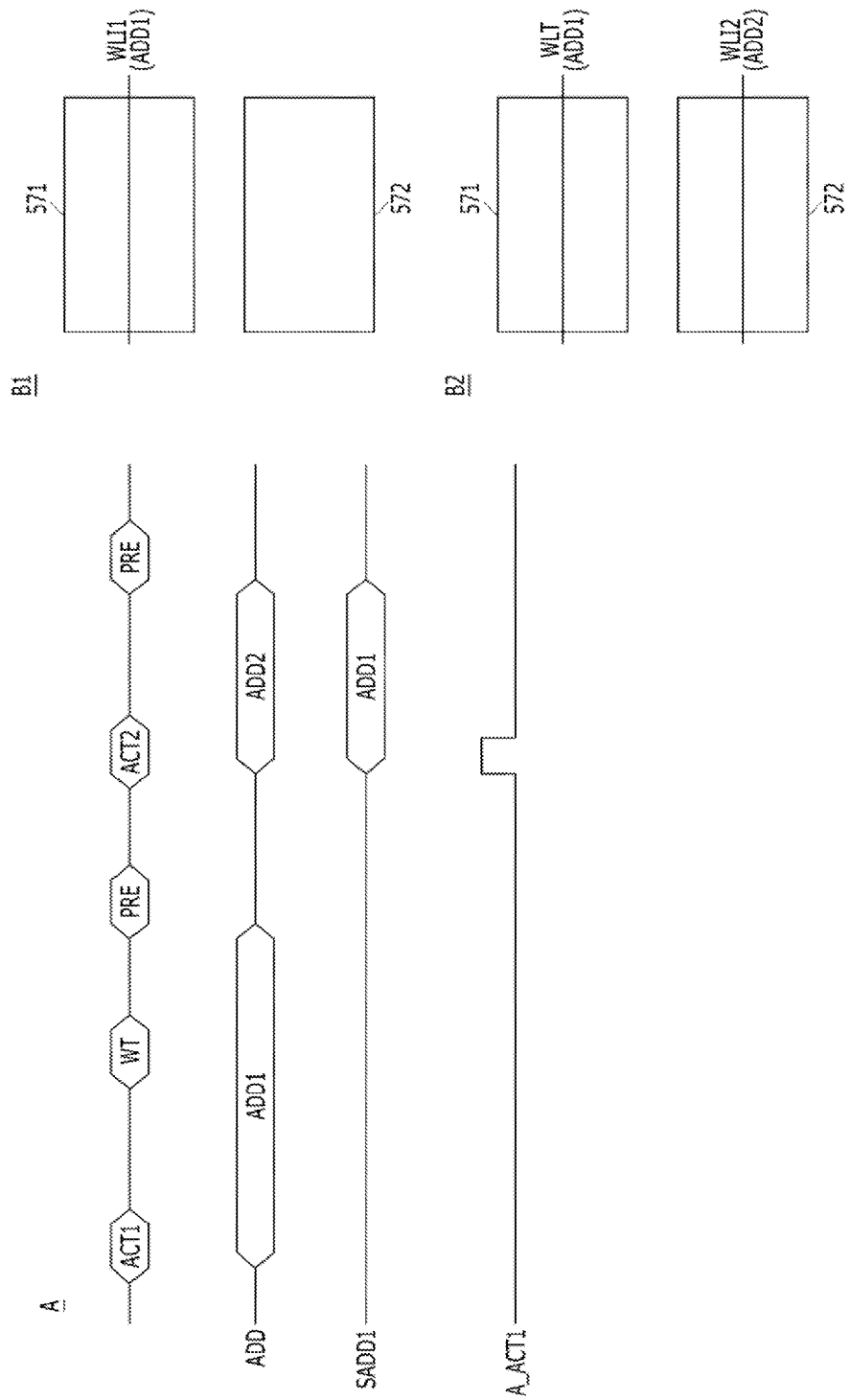

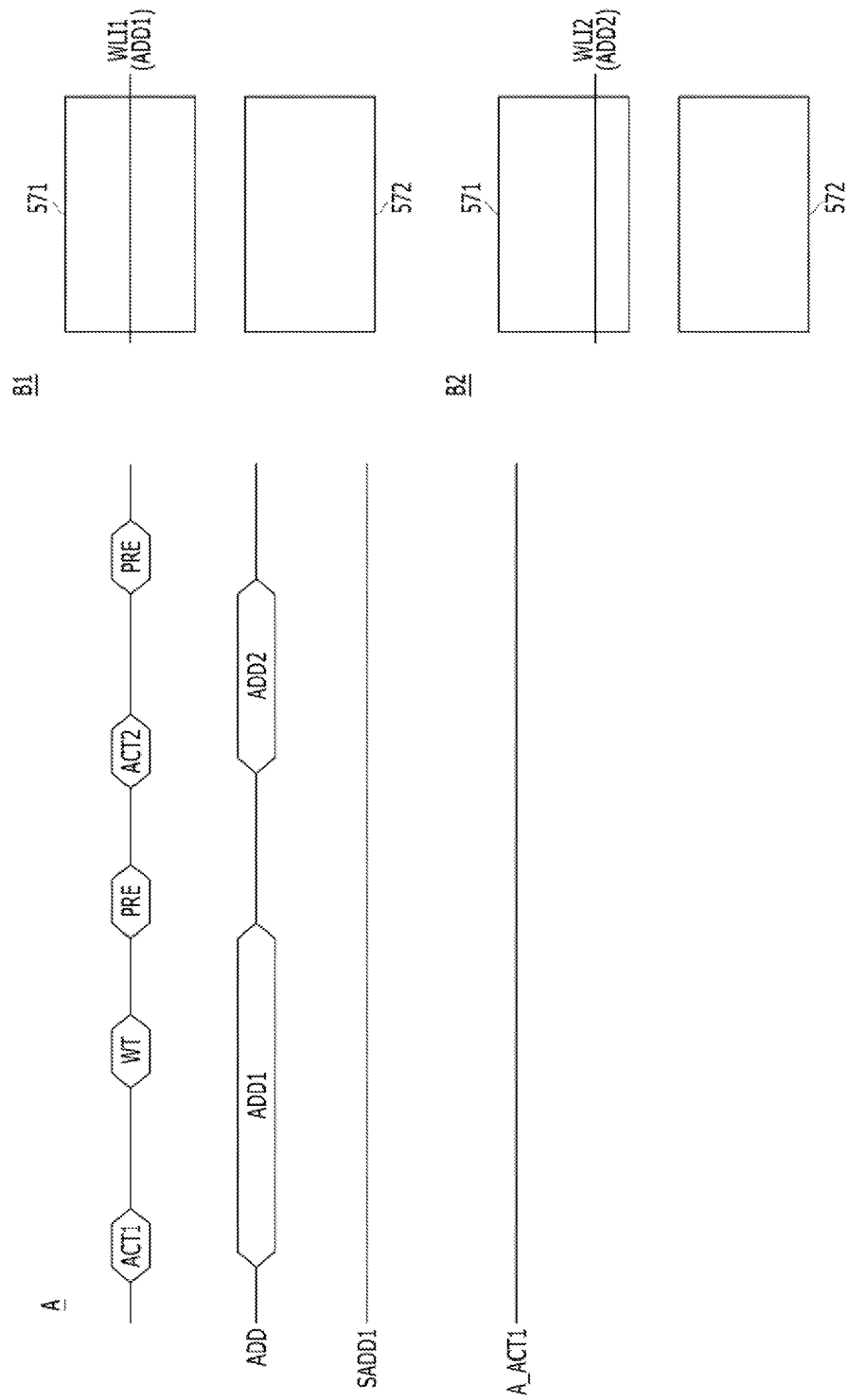

MEMORY DEVICE REFRESHING WORD LINE ACCESSED IN PREVIOUS WRITE OPERATION

CROSS-REFERENCE TO RELATED APPLICATIONS

The present application claims priority of Korean Patent Application No. 10-2014-0184129, filed on Dec. 19, 2014, which is incorporated herein by reference in its entirety.

BACKGROUND

1. Field

Exemplary embodiments of the present invention relate to a memory device.

2. Description of the Related Art

A memory device performs the operations of reading and writing data as requested from an external source, for example, a system or controller thereof. The basic unit for storing data is a memory cell. In a memory device, one memory cell includes one capacitor, which stores 1-bit data. In a write operation, data is stored in a memory cell by charging or discharging the capacitor. In a read operation, the polarity (e.g. "0" or "1") of the data stored in the memory cells is determined by the amount of electric charge stored in the capacitor.

"Write recovery time (tWR)" is a common performance measurement of memory devices. The write recovery time is the period of time from when a write operation is performed, and data is stored in memory cells of the memory device, to when the stored data is no longer influenced, even by pre-charge operations. That is to say, write recovery time (tWR) is the minimum time necessary to properly store data in memory cells of a memory device from when a write command given.

Write recovery time has an effect on write operation speed. That is to say, the write operation speed of the memory device may slow as the write recovery time gets longer, and the write operation speed of the memory device may increase as the write recovery time shortens. Therefore, there is often a trade-off between high-speed performance and securing sufficient write recovery time for stable write operations. Various studies have been done on methods for operating memory devices at high speed and simultaneously preventing errors that occur due to a lack of write recovery time.

SUMMARY

Various embodiments are directed to provide a memory device capable of reducing errors caused by lack of write recovery time by activating and pre-charging a word line, which has been accessed during a previous write operation, in a section in which another word line is activated.

Also, various embodiments are directed to provide a memory device capable of efficiently operating memory banks thereof by activating two or more word lines in one memory bank.

In an embodiment, a memory device includes a memory bank including a plurality of word lines, and a word line controller capable of activating a first word line, which is accessed during a previous write operation, among the plurality of word lines, while activating a second word line corresponding to an input address among the plurality of word lines, during an active operation.

In an embodiment, a memory device includes a first memory bank including first and second memory blocks which include a plurality of word lines, a second memory bank including third and fourth memory blocks which include a plurality of word lines, a bank selection unit capable of selecting one memory bank, of the first and second memory banks, corresponding to a bank address, a first word line controller capable of, when the first memory bank is selected, activating a first word line which is accessed during a previous write operation, among the plurality of word lines in the first memory bank, while activating a second word line corresponding to an input address among the plurality of word lines in the first memory bank, during an active operation, and a second word line controller capable of, when the second memory bank is selected, activating a third word line which is accessed in the second memory bank during the previous write operation, among the plurality of word lines in the second memory bank, while activating a fourth word line corresponding to the input address among the plurality of word lines in the second memory bank, during the active operation.

In an embodiment, a memory device includes a plurality of memory banks including a plurality of memory blocks which include a plurality of word lines, a bank selection unit capable of selecting a memory bank, of the plurality of memory banks, corresponding to a bank address, and a plurality of word line controllers capable of, when a corresponding memory bank among the plurality of memory banks is selected, activating a first word line which is accessed during a previous write operation, among the plurality of word lines in the corresponding memory bank, while activating a second word line corresponding to an input address among the plurality of word lines, during an active operation.

BRIEF DESCRIPTION OF THE DRAWINGS

FIGS. 2A and 2B are views explaining the operation of the memory device illustrated in FIG. 1;

FIGS. 6A and 6B are views explaining the operation of the memory device illustrated in FIG. 5;

DETAILED DESCRIPTION

Figure 1:
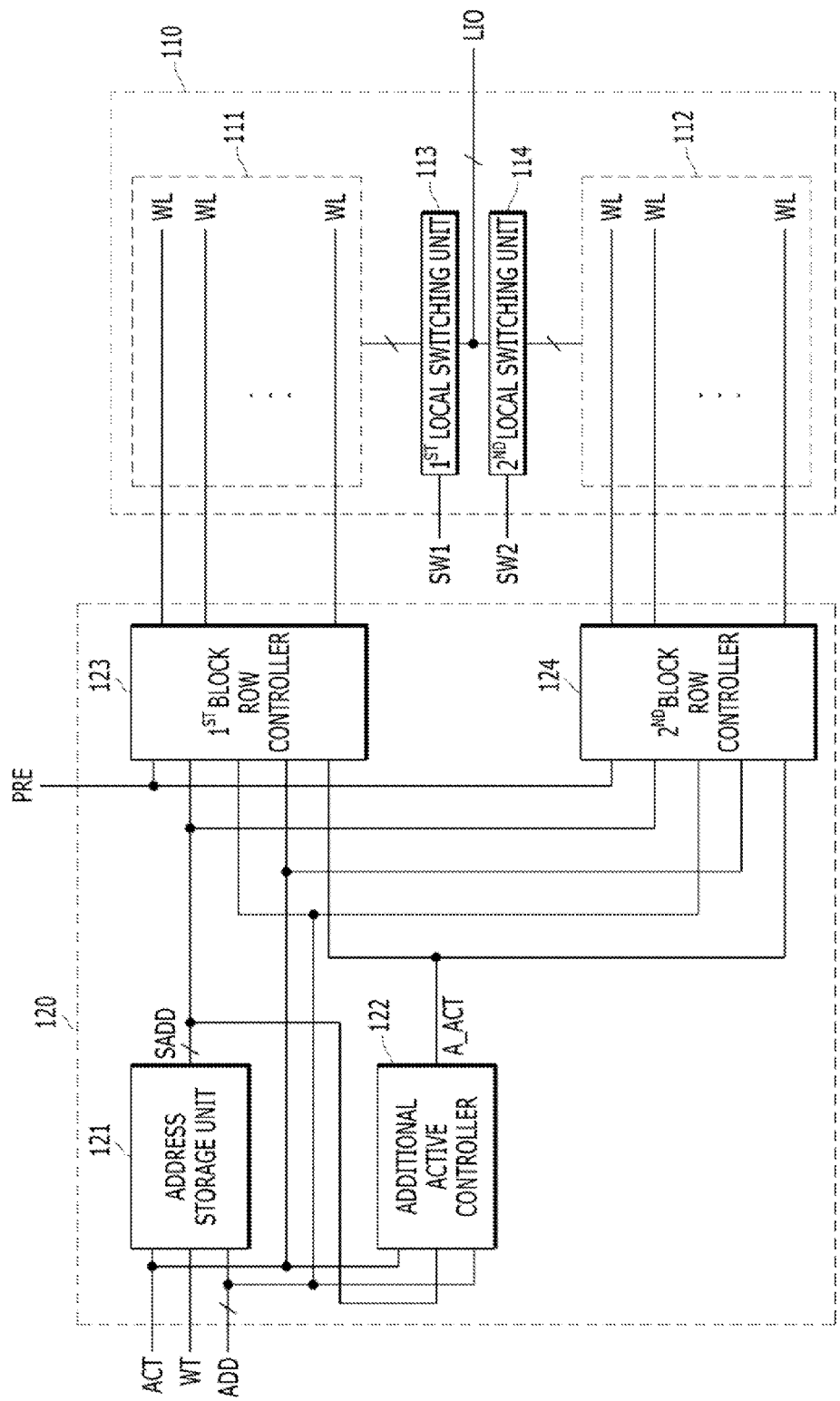
FIG. 1 is a block diagram illustrating the configuration of a memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless stated otherwise.

FIG. 1 is a block diagram illustrating the configuration of a memory device in accordance with an embodiment of the present invention.

Referring to FIG. 1, the memory device may include a memory bank 110 and a word line controller 120. The memory bank 110 may include first and second memory blocks 111 and 112, a local data bus LIO, and first and second local switching units 113 and 114.

The first and second memory blocks 111 and 112 may include a plurality of word lines WL. A plurality of memory cells (not shown in FIG. 1) may be connected to each word line L. Here, the memory cell may be a DRAM cell. The memory device may activate a word line corresponding to an input address ADD among the plurality of word lines WL, and may either write data to memory cells connected to the activated word line, or read data from the memory cells connected to the activated word line. The input address ADD may include a block address for selecting one memory block of the first and second memory blocks 111 and 112.

The local data bus LIO may transfer data to be written to a selected memory block of the first and second memory blocks 111 and 112 when writing the data, and may transfer data of a selected memory block of the first and second memory blocks 111 and 112 when reading the data.

The first local switching unit 113 connects the first memory block 111 to the local data bus LIO when a first switching signal SW1 is activated, and disconnects the first memory block 111 from the local data bus LIO when the first switching signal SW1 is inactivated. The first switching signal SW1 may be activated when the first memory block 111 is selected by the input address ADD.

The second local switching unit 114 connects the second memory block 112 to the local data bus LIO when a second switching signal SW2 is activated, and disconnects the second memory block 112 from the local data bus LIO when the second switching signal SW2 is inactivated. The second switching signal SW2 may be activated when the second memory block 112 is selected by the input address ADD.

During an active operation, the word line controller 120 may activate a word line corresponding to the input address ADD among the plurality of word lines WL. In the active section of the word line, the word line controller 120 may additionally activate a word line accessed during a previous write operation. That is to say, the word line controller 120 may activate two word lines at a time in the memory bank 110. The word line accessed during the previous write operation may be activated during an active operation prior to the current active operation and be selected, ices, targeted during the following write operation.

When a word line corresponding to the input address ADD and a word line accessed during the previous write operation are in the same memory block, the word line controller 120 may activate only the word line corresponding to the input address ADD. This is because data of memory cells may collide when two word lines are activated in one memory block. In contrast, when activated word lines are in different memory blocks, data collision does not occur because the non-selected memory block is not connected to (i.e. is disconnected from) the local data bus LIO.

The word line controller 120 may include an address storage unit 121, an additional active controller 122, and first and second block row controllers 123 and 124. The address storage unit 121 may store the current input address ADD, i.e. an address of an activated word line, when an active command ACT and a write command WT are applied to the address storage unit 121.

The additional active controller 122 may compare the input address ADD with an address SADD of the address storage unit 121 and activate an additional active signal A_ACT based on a comparison result when the active command ACT is applied to the additional active controller 122. The additional active controller 122 does not activate the additional active signal A_ACT when the block address of the input address ADD and the block address of the address SADD are identical to each other, i.e. when the same memory block is selected, and activates the additional active signal A_ACT when the block addresses are different from each other.

The block row controllers 123 and 124 may control word lines of corresponding memory blocks, respectively. The block row controllers 123 and 124 may activate a word line corresponding to the input address ADD in response to the active command ACT, and activate a word line corresponding to the address SADD in response to the additional active signal A_ACT. The block row controllers 123 and 124 may pre-charge an activated word line when a pre-charge command PRE is activated.

Figure 2A:
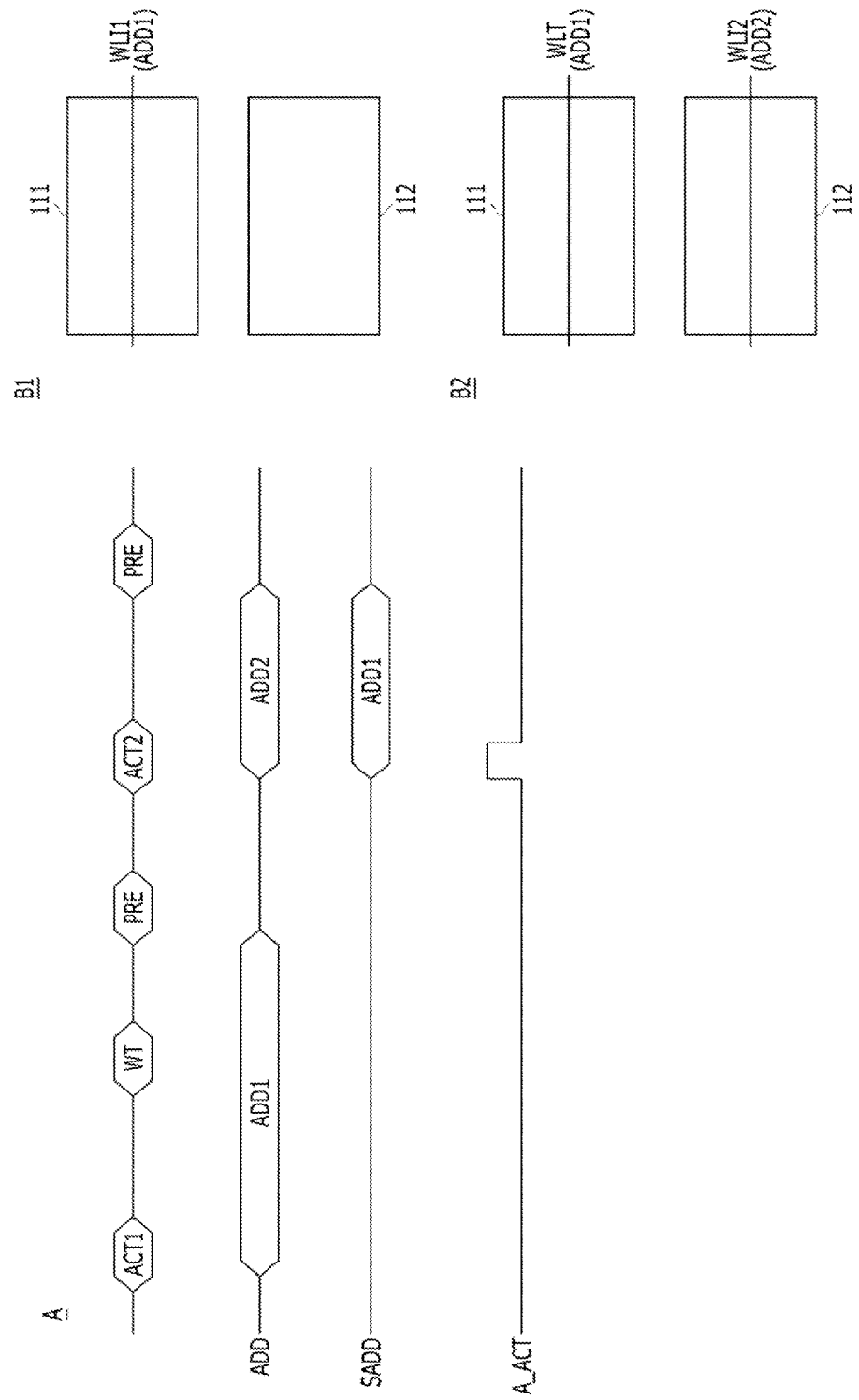

FIGS. 2A and 2B are views explaining the operation of the memory device illustrated in FIG. 1.

In FIGS. 2A and 2B, the respective left side waveform diagrams 'A' explain the operation of the memory device, and the respective right-side block diagrams "B1" and "B2" illustrate the memory bank 110 and the memory blocks 111 and 112 for explaining the operations of the memory device. In particular, the block diagrams "B1" explain a first active operation of the memory device, and the block diagrams "B2" explain a second active operation of the memory device, Hereinafter, "WLI1" and "WLI2" represent word lines corresponding to an input address ADD, and "WLT" represents a word line corresponding to a stored address SADD.

FIG. 2A illustrates the operation of the memory device when mutually different memory blocks are selected by the input address ADD and the stored address SADD, and FIG. 2B illustrates the operation of the memory device when the same memory block is selected by the input address ADD and the stored address SADD.

Referring to FIG. 2A, when a first active command ACT1 and a first input address ADD1 are inputted, the word line WLI1 (which is a word line of the first memory block 111) corresponding to the input address ADD1 is activated. When a write command WT is applied, data transferred through the local data bus LIO is written to memory cells connected to the activated word line WLI1, and the input address ADD, i.e. the address of the currently activated word line WLI1, is stored. When a pre-charge command PRE is applied, the activated word line WLI1 is pre-charged (see the block diagram "B1").

When a second active command ACT2 and a second input address ADD2 are inputted, the word line WLI2 corresponding to the input address ADD2 is activated. In this case, since the input address ADD2 corresponds to the second memory block 112, and the stored address SADD corresponds to the first memory block 111 the additional active signal A_ACT is activated, and the word line WLT corresponding to the stored address SADD may be additionally activated. When the precharge command PRE is applied, the activated word lines WLT and WLI2 may be pre-charged (see the drawing block diagram "B2").

Referring to FIG. 2B, a first active operation (see the block diagram "B1") is performed in the same manner as that described with reference to FIG. 2A, and thus the input address ADD1 is stored. Next, during a second active operation (see the block diagram "B2"), since the input address ADD2 and the stored address SADD both correspond to the first memory block 111, the additional active signal A_ACT is not activated, only the word line WLI2 corresponding to the input address ADD2 is activated.

The memory device may activate and pre-charge a word line, on which a write operation has been performed, together with a word line corresponding to an input address ADD in the following active operation. When a word line is activated for a predetermined period of time, data of memory cells connected to the activated word line may be amplified by a bit line sense amplification circuit (not shown in FIG. 1) and may be rewritten. Therefore, although data is insufficiently written during a previous write operation, the data is compensated for in the following active operation, so that problems due to lack of data recovery time may be prevented. In addition, since the aforementioned operation is performed in a section in which another word line is activated, the memory bank 110 may be efficiently controlled without delaying another active operation.

Figure 3:
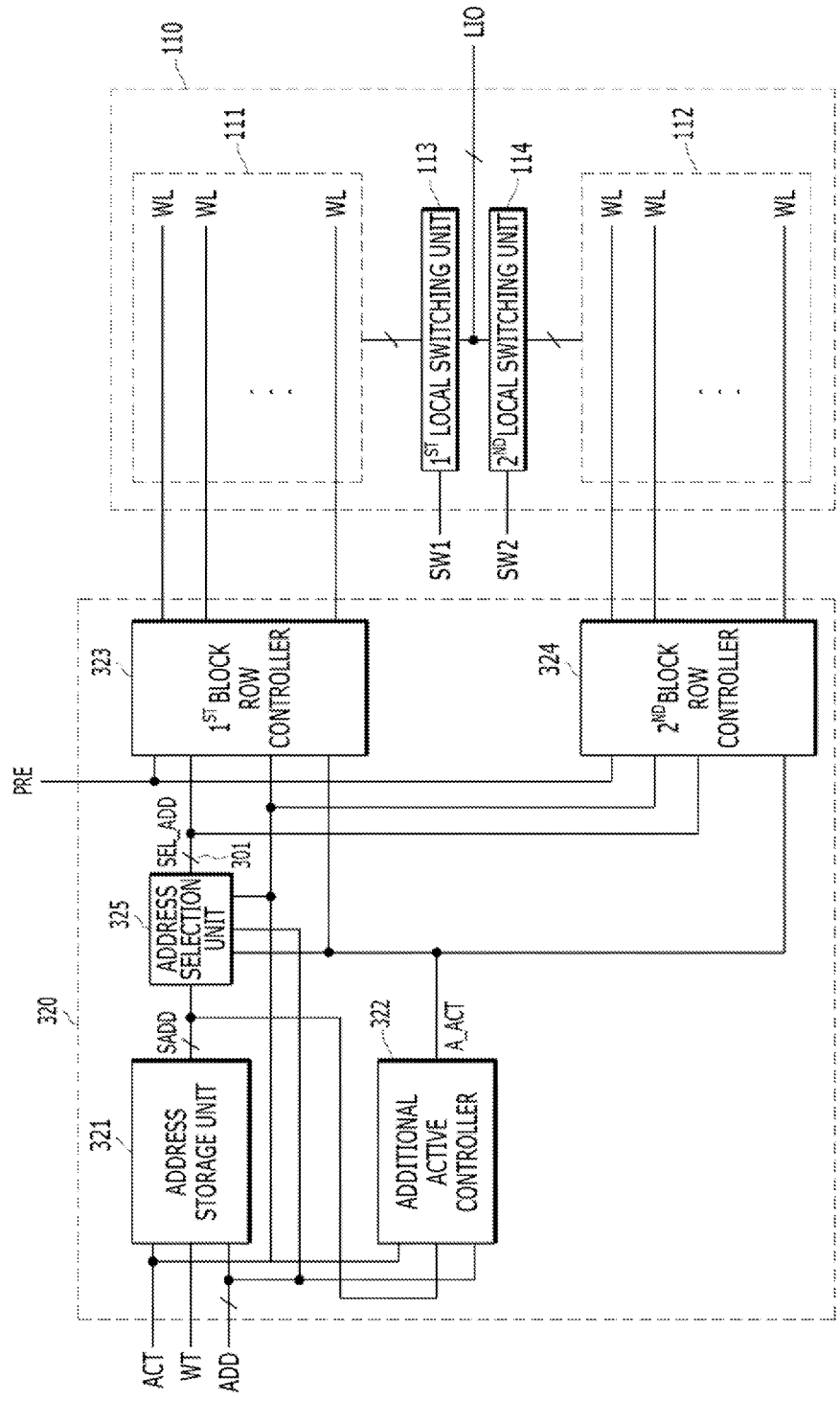
FIG. 3 is a block diagram illustrating the configuration of a memory device in accordance with an embodiment of the present invention.

FIG. 3 is a block diagram illustrating the configuration of a memory device in accordance with an embodiment of the present invention.

Referring to FIG. 3, the memory device may include a memory bank 110 and a word line controller 320. The memory bank 110 may include first and second memory blocks 111 and 112, a local data bus LIO, and first and second local switching units 113 and 114. Among the components of the memory devices illustrated in FIGS. 1 and 3, components having the same reference numbers are the same in the configurations and operations thereof.

In the memory device illustrated in FIG. 3, a line 301 may be shared for transferring an input address ADD and a stored address SADD to the memory block from the word line controller 320. To this end, the word line controller 320 may include an address storage unit 321, an additional active controller 322, first and second block row controllers 323 and 324, and an address selection unit 325.

The address storage unit 321 may store the current input address ADD, i.e. an address of an activated word line, when an active command ACT and a write command WT are applied to the address storage unit 321.

When an active command ACT is applied to the additional active controller 322, the additional active controller 322 may compare the input address ADD with an address SADD of the address storage unit 321. The additional active controller 322 may activate an additional active signal A_ACT based on a comparison result after a predetermined period of time passes from the application of the active command ACT. The predetermined period of time may be same as or longer than the RAS-to-RAS Delay "tRRD" as defined in the specification of the memory device.

The address selection unit 325 may select and output the input address ADD as a signal SEL_ADD when the active command ACT is activated, and may select and output the stored address SADD as the signal SEL_ADD when the additional active signal A_ACT is activated.

The block row controllers 323 and 324 may activate a word line, which corresponds to an address outputted from the address selection unit 325, in response to the active command ACT or the additional active signal A_ACT.

Figure 4A:
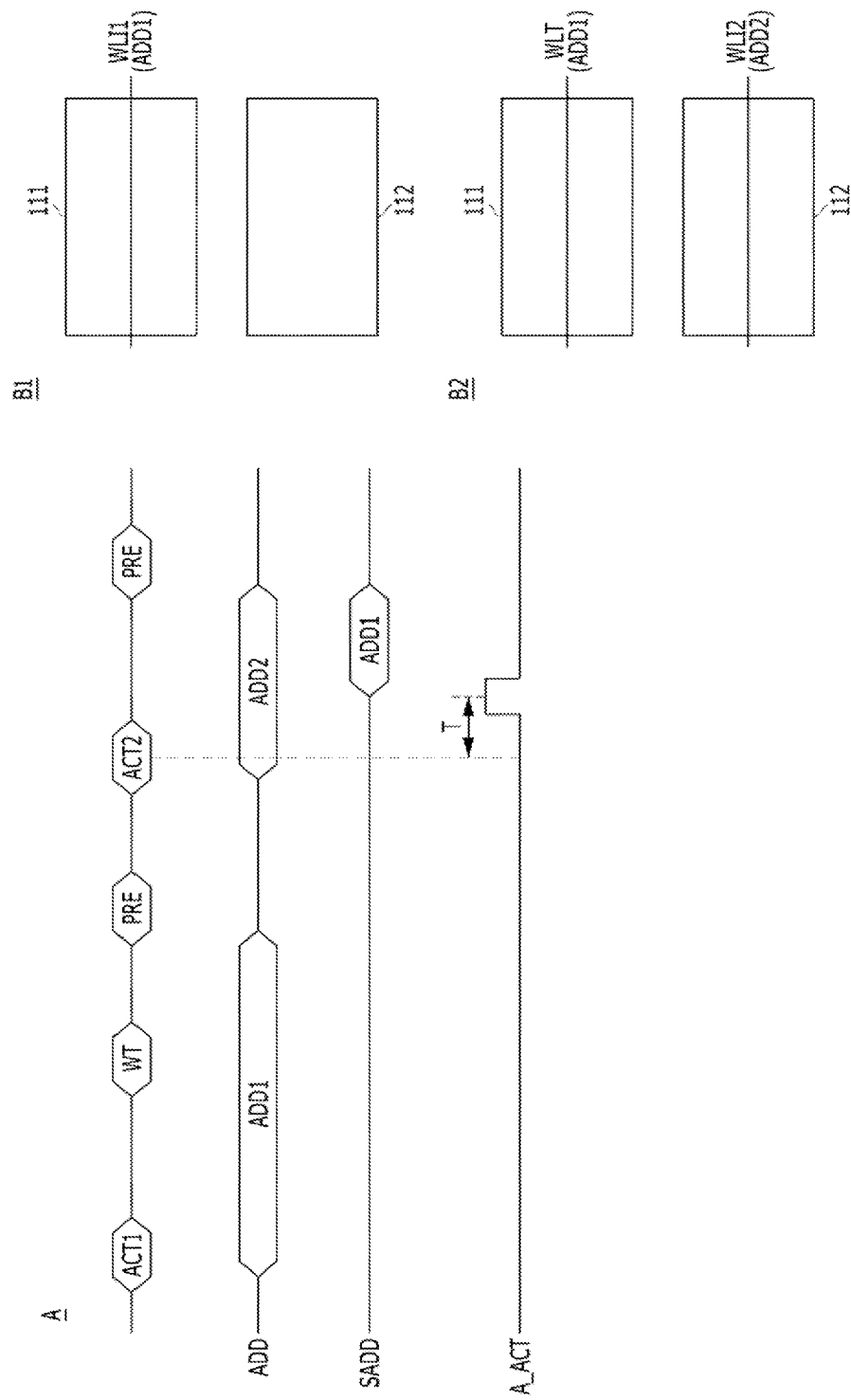
FIGS. 4A and 4B are views explaining the operation of the memory device illustrated in FIG. 3.
Figure 4B:
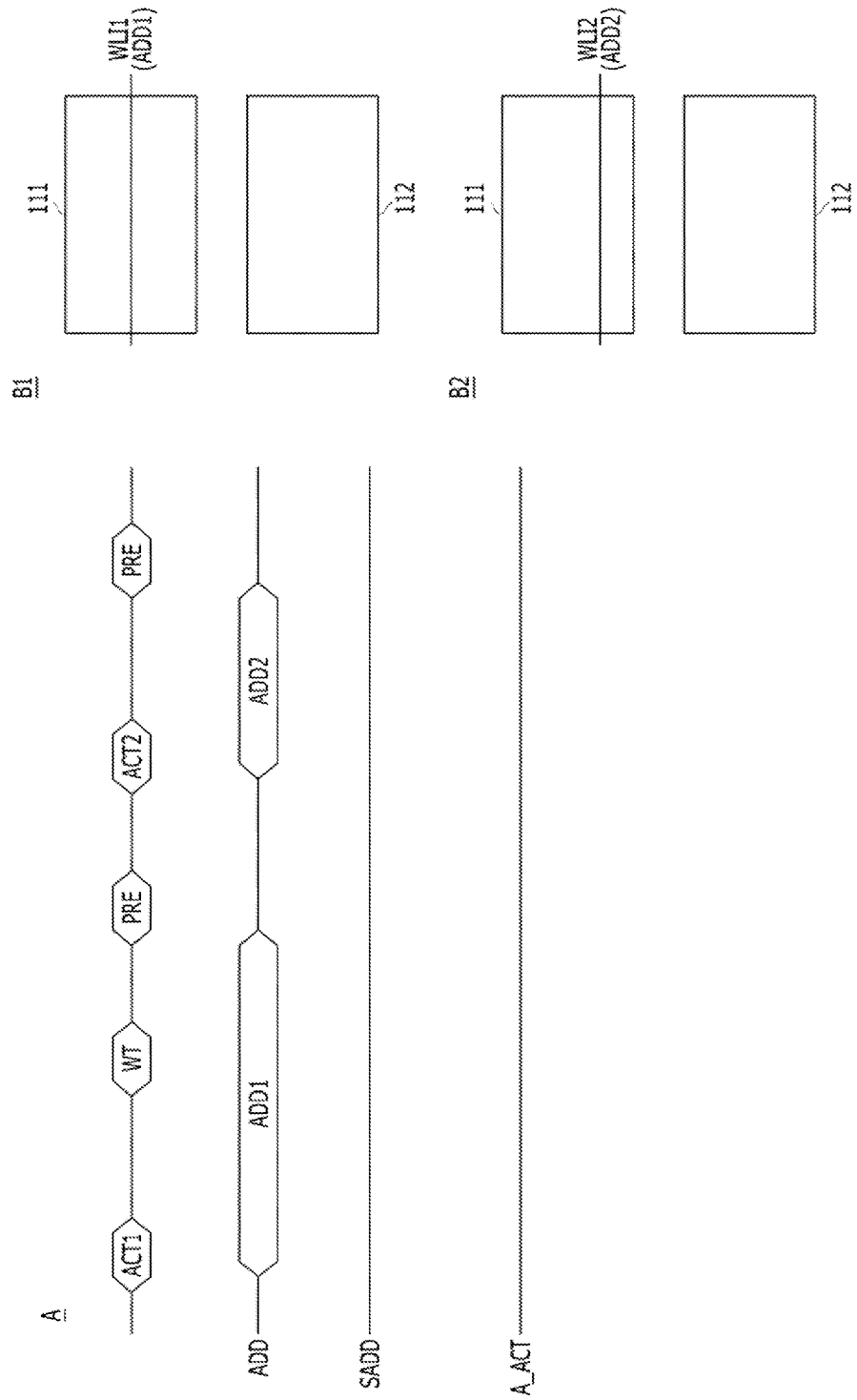

FIGS. 4A and 4B are views explaining the operation of the memory device illustrated in FIG. 3.

In FIGS. 4A and 4B, the respective left-side waveform diagrams "A" explain the operation of the memory device, and the respective right-side block diagram "B1" and "B2" illustrates the memory bank 110 and the memory blocks 111 and 112 for explaining the operation of the memory device. In particular, the block diagrams "B1" are shown to explain a first active operation of the memory device, and the block diagrams "B2" are shown to explain a second active operation of the memory device. "WLI1" and "WLI2" represent word lines corresponding to an input address ADD, and "WLT" represents a word line corresponding to a stored address SADD.

FIG. 4A illustrates the operation of the memory device when mutually different memory blocks are selected by the input address ADD and the stored address SADD, and FIG. 4B illustrates the operation of the memory device when the same memory block is selected by the input address ADD and the stored address SADD. In FIGS. 4A and 4B, the first active operation (i.e. an active operation corresponding to a first active command ACT1) is the same as that described with reference to FIG. 2A.

Referring to FIG. 4A, when a second active command ACT2 and a second input address ADD2 are inputted, the word line WLI2 corresponding to the input address ADD2 is activated. Since the input address ADD2 corresponds to the second memory block 112, and the stored address SADD corresponds to the first memory block 111, the additional active signal A_ACT is activated after a predetermined period of time passes from the activation of the active command ACT2. The word line WLT corresponding to the stored address SADD may be additionally activated. When a precharge command PRE is applied, the activated word lines WLT and WLI2 may be pre-charged (see the block diagrams "B2").

Referring to FIG. 4B, during a second active operation (see the block diagram "B2"), since the input address ADD2 and the stored address SADD both correspond to the first memory block 111, the additional active signal A_ACT is not activated, only the word line WLI2 corresponding to the input address ADD2 is activated.

Figure 5:
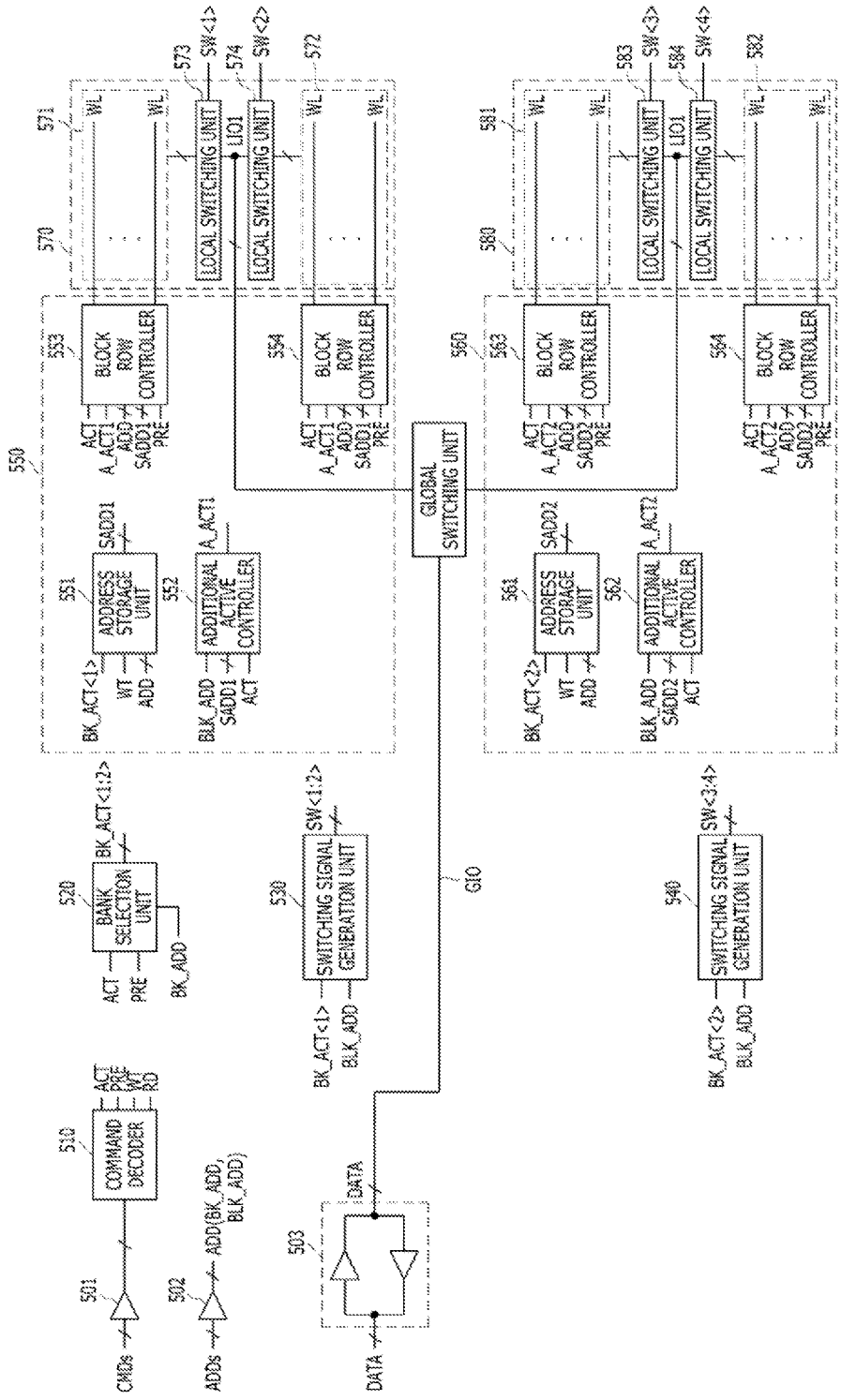
FIG. 5 is a block diagram illustrating the configuration of a memory device in accordance with an embodiment of the present invention.

FIG. 5 is a block diagram illustrating the configuration of a memory device in accordance with an embodiment of the present invention.

Referring to FIG. 5, the memory device may include a command input unit 501, an address input unit 502, a data input/output unit 503, a command decoder 510, a bank selection unit 520, switching signal generation units 530 and 540, word line controllers 550 and 560, and memory banks 570 and 580.

The command input unit 501 may receive commands CMDs applied from a memory controller, and the address input unit 502 may receive addresses ADDs applied from the memory controller. The data input/output unit 503 may receive data DATA applied from the memory controller, or may transfer data in the memory device to the memory controller. Each of the commands CMDs, addresses ADDs and data DATA may include multi-bit signals. The addresses ADDs applied together with an active command may include a band address BK_ADD for selecting a memory bank, and a block address BLK_ADD for selecting a memory block.

The command decoder 510 may decode the commands CMDs inputted through the command input unit 501 and generate an active command ACT, a pre-charge command PRE, a write command WT, and a read command RD. The command decoder 510 may activate a command, among the commands ACT, PRE, WT and RD, which is indicated by a combination of the commands CMDs.

The first and second memory banks 570 and 580 may include memory blocks 571, 572, 581 and 582, local data buses LIO1 and LIO2, and local switching units 573, 574, 583 and 584. The memory blocks 571, 572, 581 and 582 may include a plurality of word lines WL. A plurality of memory cells (not shown in FIG. 5) may be connected to each word line WL. The memory device may activate a word line, among the plurality of word lines WL, corresponding to an input address ADD, and may either write data to memory cells connected to the activated word line or read data from the memory cells connected to the activated word line.

The bank selection unit 520 may generate first and second bank active signals BK_ACT<1:2> in response to the active command ACT, the pre-charge command PRE and the bank address BK_ADD. The bank selection unit 520 may activate the bank active signal BK_ACT<1> or BK_ACT<2> of a memory bank selected by the bank address BK_ADD when the active command ACT is applied, and may inactivate the activated bank active signal BK_ACT<1> or BK_ACT<2> when the pre-charge command PRE is applied.

The switching signal generation units 530 and 540 may generate switching signals SW<1:4> in response to the bank active signals BK_ACT<1:2> and the block address BLK_ADD. When the bank active signals BK_ACT<1:2> are activated, corresponding to the switching signal generation units 530 and 540, respectively, the switching signal generation units 530 and 540 may activate the switching signal SW<1>, SW<2>, SW<3>, or SW<4> of a memory block selected by the block address BLK_ADD.

The local data buses LIO1 and LIO2 may transfer data of the selected memory block 571, 572, 581 or 582 in the respective memory banks 570 and 580. A global bus GIO may transfer data between the data input/output unit 503 and the local data bus LIO1 or LIO2 corresponding to the selected memory block 571, 572, 581 or 582.

The local itching units 573, 574, 583 and 584 may connect corresponding memory blocks and corresponding local data buses when the respective switching signals SW<1:4> are activated. In contrast, the local switching units 573, 574, 583 and 584 may disconnect corresponding memory blocks and corresponding local data buses from each other when the respective switching signals SW<1:4> are inactivated. The global switching unit 504 may connect the global data bus GIO and the local data bus LIO1 or LIO2 corresponding to the selected memory block 571, 572, 581 or 582.

The word line controllers 550 and 560 may activate a word line corresponding to the input address ADD when the respective memory banks 570 and 580 are selected in an active operation. In the active section of the word line, the word line controllers 550 and 560 may additionally activate a word line accessed during a previous write operation. Here, when the word line corresponding to the input address ADD and the word line accessed during the previous write operation are included in the same memory block, the word line controllers 550 and 560 may activate only the word line corresponding to the input address ADD.

The word line controllers 550 and 560 may include address storage units 551 and 561, additional active controllers 552 and 562, and block row controllers 553, 554, 563 and 564. The address storage units 551 and 561 may store the address ADD of an activated word line when the write command WT is applied when the respective bank active signals BK_ACT<1:2> are activated.

When the active command ACT is applied, the additional active controller 552 and 562 may compare the input address ADD with addresses SADD1 and SADD2 of the respective address storage units 551 and 561, and may activate additional active signals A_ACT1 and A_ACT2 respectively, based on a comparison result. The additional active controller 552 and 562 may not activate the additional active signals A_ACT1 and A_ACT2 when the input address ADD and the addresses SADD1 and SADD2 correspond to the same memory block (i.e. when the block addresses thereof are the same), and may active the additional active signals A_ACT1 and A_ACT2 when the input address ADD and the addresses SADD1 and SADD2 correspond to mutually different memory blocks (i.e. when the block addresses thereof are different from each other).

FIGS. 6A and 66 are views explaining the operation of the memory device illustrated in FIG. 5.

In FIGS. 6A and 6B, the respective left-side waveform diagrams "A" explain the operation of the memory device, and the respective right-side block diagrams "B1" and "B2" illustrate a selected memory bank 570 and the memory blocks 571 and 572 of the selected memory bank 570 for explaining the operation of the memory device. In particular, the block diagrams "B1" are shown to explain a first active operation of the memory device, and the block diagrams "B2" are shown to explain a second active operation of the memory device. An example will now be given in which only the first memory bank 570 is selected. Additionally, "WLI1" and "WLI2" represent word lines corresponding to an input address ADD, and "WLT" represents a word line corresponding to a stored address SADD.

FIG. 6A illustrates the operation of the memory device when mutually different memory blocks are selected by the input address ADD and the stored address SADD1, and FIG. 6B illustrates the operation of the memory device when the same memory block is selected by the input address ADD and the stored address SADD1.

Referring to FIG. 6A, when a first active command ACT1 and a first input address ADD1 are inputted, a bank active signal BK_ACT<1> is activated, and the word line Mil (which is a word line of the first memory block 571) corresponding to the input address ADD1 is activated. When a write command WT is applied, data transferred through the local data bus LIO1 is written to memory cells connected to the activated word line Mil and the input address ADD1 is stored. When a pre-charge command PRE is applied the activated word line WLI1 is pre-charged (see the block diagram B1").

When a second active command ACT2 and a second input address ADD2 are inputted, a bank active signal BK_ACT<1> is activated, and the word line WLI2 corresponding to the input address ADD2 is activated. Since the input address ADD2 corresponds to the second memory block 572, and the stored address SADD1 corresponds to the first memory block 571, the additional active signal A_ACT1 is activated, and the word line WLT corresponding to the stored address SADD1 may be additionally activated. When the pre-charge command PRE is applied, the activated word lines WLT and WLI2 may be pre-charged (see the block diagram "B2").

Referring to FIG. 6B, a first active operation (see the block diagram "B1") is performed in the same manner as that described with reference to FIG. 6A, and thus the input address ADD1 is stored. Next during a second active operation (see the block diagram "B2"), since the input address ADD2 and the stored address SADD1 both correspond to the first memory block 571, the additional active signal A_ACT1 is not activated, only the word line WLI2 corresponding to the input address ADD2 is activated.

Figure 7:
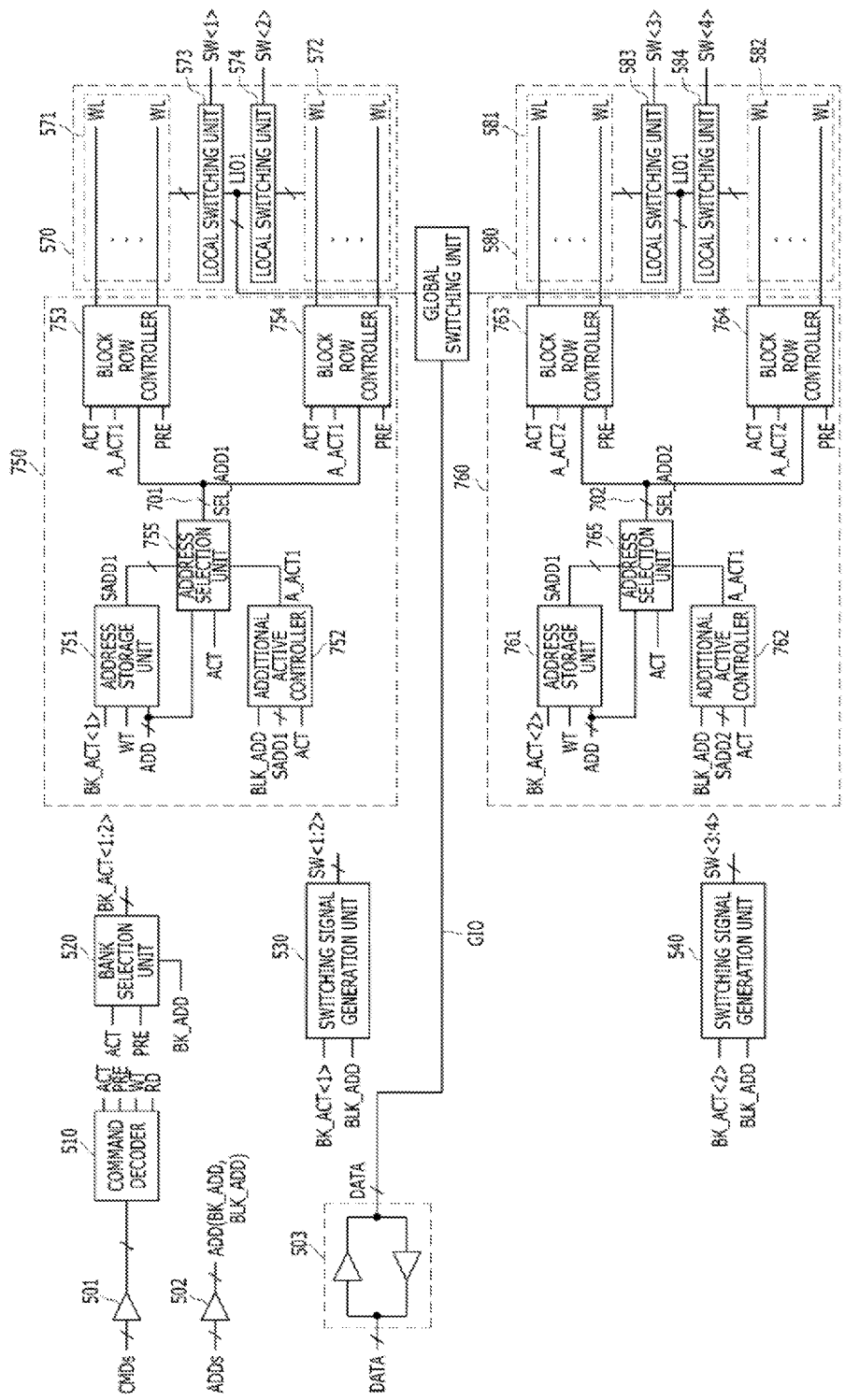
FIG. 7 is a block diagram illustrating the configuration of a memory device in accordance with an embodiment of the present invention.

FIG. 7 is a block diagram illustrating the configuration of a memory device in accordance with an embodiment of the present invention.

Referring to FIG. 7, the memory device may include a command input unit 501, an address input unit 502, a data input/output unit 503, a command decoder 510, a bank selection unit 520, switching signal generation units 530 and 540, word line controllers 750 and 760, and memory banks 570 and 580. Among the components of the memory devices illustrated in FIGS. 5 and 7, components having the same reference numbers are the same in the configurations and operations thereof.

In the memory device of FIG. 7, the word line controllers 750 and 760 may share lines 701 and 702 for transferring an input address ADD and stored addresses SADD1 and SADD2 to memory blocks. To this end, the word line controllers 750 and 760 may include address storage units 751 and 761, additional active controllers 752 and 762, block row controllers 753, 754, 763 and 764, and address selection units 755 and 765.

The address storage units 751 and 761 may store the address ADD of an activated word line when a write command WT is applied when the respective bank active signals BK_ACT<1:2> are activated.

When an active command ACT is applied to the additional active controllers 752 and 762, the additional active controllers 752 and 762 may compare the input address ADD with addresses SADD1 and SADD2 of the respective address storage units 751 and 761. The additional active controllers 752 and 762 may activate additional active signals A_ACT1 and A_ACT2 based on a comparison result after a predetermined period of time passes from the application of the active command ACT. In this case, the predetermined period of time may be a period of time which is the same as or longer than the RAS-to-RAS Delay "tRRD" as defined in the specification of the memory device.

The address selection units 755 and 765 may select and output the input address ADD as signals SEL_ADD1 and SEL_ADD2 when the active command ACT is activated; and may select and output the stored addresses SADD1 and SADD2 as the signals SEL_ADD1 and SEL_ADD2 when the additional active signals A_ACT1 and A_ACT2 are activated.

The block row controllers 753, 754, 763 and 764 may activate a word line, which corresponds to an address outputted from the address selection units 755 and 765, in response to the active command ACT or the additional active signals A_ACT1 and A_ACT2.

Figure 8A:
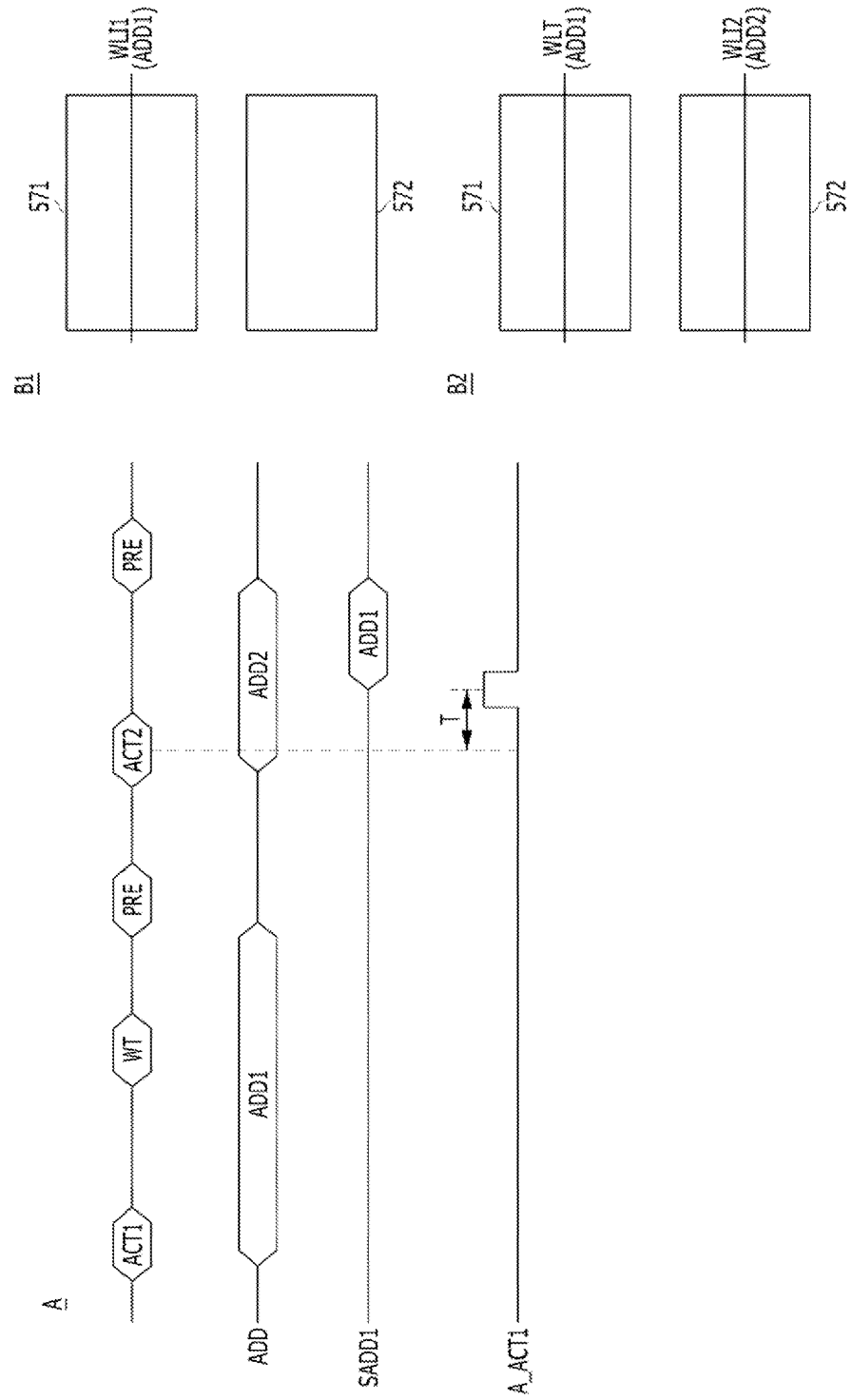
FIGS. 8A and 8B are views explaining the operation of the memory device illustrated in FIG. 7.
Figure 8B:
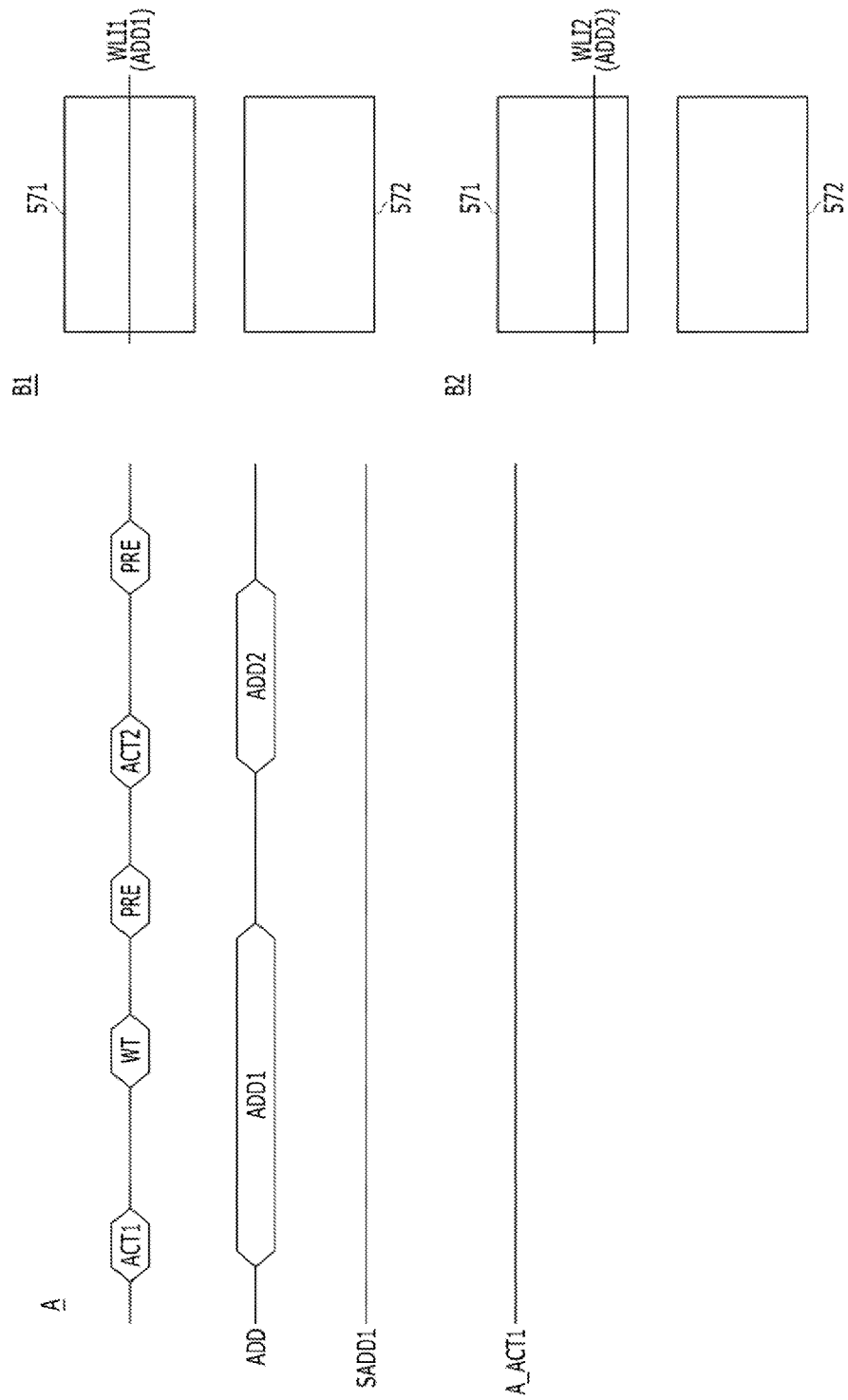

FIGS. 8A and 8B are views explaining the operation of the memory device illustrated in FIG. 7.

In FIGS. 8A and 8B, the respective left side waveform diagrams "A" explain the operation of the memory device, and the respective right-side block diagrams "B1" and "B2" illustrate a selected memory bank 570 and the memory blocks 571 and 572 of the selected memory bank 570 for explaining the operation of the memory device. In particularly, the block diagrams "B1" are shown to explain a first active operation of the memory device, and the block diagrams "B2" are shown to explain a second active operation of the memory device. Hereinafter, only an example will be given only for when the first memory bank 570 is selected. Hereinafter, "WLI1" and "WLI2" represent word lines corresponding to an input address ADD, and "WLT" represents a word line corresponding to a stored address SADD.

FIG. 8A illustrates the operation of the memory device when mutually different memory blocks are selected by the input address ADD and the stored address SADD1 and FIG. 8B illustrates the operation of the memory device when the same memory block is selected by the input address ADD and the stored address SADD1. In FIGS. 8A and 8B, the first active operation (i.e. an active operation corresponding to a first active command ACT1) is the same as that described with reference to FIG. 6A.

Referring to FIG. 8A, when a second active command ACT2 and a second input address ADD2 are inputted, the word line WLI2 corresponding to the input address ADD2 is activated. Since the input address ADD2 corresponds to the second memory block 572, and the stored address SADD1 corresponds to the first memory block 571, the additional active signal A_ACT1 is activated after a predetermined period of time passes from the activation of the active command ACT2. The word line WLT corresponding to the stored address SADD1 may be additionally activated. When a pre-charge command PRE is applied, the activated word lines WLT and WLI2 may be pre-charged (see the block diagrams "B2").

Referring to FIG. 8B during a second active operation (see the block diagram "B2"), since the input address ADD2 and the stored address SADD1 both correspond to the first memory block 571, the additional active signal A_ACT1 is not activated, only the word line WLI2 corresponding to the input address ADD2 is activated.

FIGS. 5 and 7 illustrate when a memory device includes two memory banks and each memory bank includes two memory blocks. However, the number of memory banks included in a memory device and the number of memory blocks included in a memory bank may vary depending on design.

According to the present invention, when performing an active operation, a memory device refreshes a word line accessed during a previous write operation, i.e. data which has been written in memory cells connected to the word line during the previous write operation, so that data may be written at high speed without errors.

According to the present invention, two or more word lines are activated in one memory bank, so that memory devices may be more efficiently operated.

Although various embodiments have been described for illustrative purposes, it will be apparent to those skilled in the art that various changes and modifications may be made without departing from the spirit and scope of the invention as defined in the following

What is claimed is:
1. A memory device, comprising:
a memory bank comprising a plurality of word lines; and
a word line controller capable of activating a first word line, which is accessed during a previous write operation, among the plurality of word lines, while activating a second word line corresponding to an input address among the plurality of word lines, during an active operation,
when an address of the first word line and the input address are different from each other.
2. The memory device of claim 1, wherein the word line controller stores an address of the first word line accessed during the previous write operation, and activates the first word line corresponding to a stored address in an activation section of the second word line.

3. The memory device of claim 1, wherein the word line controller activates the first word line corresponding to a first input address in response to a first active command, and stores the first address when a write command is applied.

4. The memory device of claim 3, wherein the word line controller activates the first word line corresponding to a stored address and the second word line corresponding to a second input address when a second active command, following the first active command, is applied.

5. A memory device, comprising:
a first memory bank comprising first and second memory blocks which comprise a plurality of word lines;
a second memory bank comprising third and fourth memory blocks which comprise a plurality of word lines;
a bank selection unit capable of selecting one memory bank, of the first and second memory banks, corresponding to a bank address;
a first word line controller capable of, when the first memory bank is selected and an address of a first word line and an input address are different from each other, activating the first word line which is accessed during a previous write operation, among the plurality of word lines in the first memory bank, while activating a second word line corresponding to the input address among the plurality of word lines in the first memory bank, during an active operation; and
a second word line controller capable of, when the second memory bank is selected and an address of a third word line and the input address are different from each other, activating the third word line which is accessed in the second memory bank during the previous write operation, among the plurality of word lines in the second memory bank, while activating a fourth word line corresponding to the input address among the plurality of word lines in the second memory bank, during the active operation.

6. The memory device of claim 5, wherein:
the first word line controller stores an address of the first word line during the previous write operation, and activates the first word line corresponding to a stored address in an activation section of the second word line; and
the second word line controller stores an address of the third word line during the previous write operation, and activates the third word line corresponding to a stored address in an activation section of the fourth word line.

7. The memory device of claim 5, wherein:
the first word line controller activates the first word line corresponding to a first input address in response to a first active command, and stores the first input address when a write command is applied; and
the first word line controller activates the first word line corresponding to a stored address and the second word line corresponding to a second input address when a second active command, following the first active command, is applied.

8. The memory device of claim 5, wherein:
the second word line controller activates the third word line corresponding to a first input address in response to a first active command, and stores the first input address when a write command is applied; and
the second word line controller activates the third word line corresponding to a stored address and the fourth word line corresponding to a second input address when a second active command, following the first active command, is applied.

9. The memory device of claim 5, wherein:
the first word line controller inactivates the first word line during the active operation when the first and second word lines are included in a same memory block of the first and second memory blocks; and
the second word line controller inactivates the third word line during the active operation when the third and fourth word lines are included in a same memory block of the third and fourth memory blocks.

10. The memory device of claim 5, wherein
the first memory bank comprises:
a first local data bus capable of transferring data of a selected memory block of the first and second memory blocks;
a first local switching unit capable of connecting the first memory block and the first local data bus when the first memory block is selected; and
a second local switching unit capable of connecting the second memory block and the first local data bus when the second memory block is selected, and
the second memory bank comprises:
a second local data bus capable of transferring data of a selected memory block of the third and fourth memory blocks;
a third local switching unit capable of connecting the third memory block and the second local data bus when the third memory block is selected; and
a fourth local switching unit capable of connecting the fourth memory block and the second local data bus when the fourth memory block is selected.

11. The memory device of claim 5, wherein
the first word line controller comprises:
a first address storage unit capable of storing a first input address when the first memory bank is selected and a write command is applied during a first active operation;
a first additional active controller capable of activating a first additional active signal after an active command is applied, when the first memory bank is selected during a second active operation and both the first and second memory blocks are selected by a second input address and an address of the first address storage unit; and
first and second block row controllers capable of activating a word line corresponding to the second input address when a corresponding memory block of the first and second memory blocks is selected during the second active operation, and capable of activating a word line corresponding to the address of the first address storage unit when the first additional active signal is activated, and
the second word line controller comprises:
a second address storage unit capable of storing the first input address when the second memory bank is selected and the write command is applied during the first active operation;
a second additional active controller capable of activating a second additional active signal after the active command is applied, when the second memory bank is selected during the second active operation and both the third and fourth memory blocks are selected by the second input address and an address of the second address storage unit; and
third and fourth block row controllers capable of activating a word line corresponding to the second input address when a corresponding memory block of the third and fourth memory blocks is selected during the second active operation, and capable of activating a word line corresponding to the address of the second address storage unit when the second additional active signal is activated.

12. The memory device of claim 11, wherein:
the first additional active controller inactivates the first additional active signal when a same memory block of the first and second memory blocks is selected by the second input address and the address of the first address storage unit; and
the second additional active controller inactivates the second additional active signal when a same memory block of the third and fourth memory blocks is selected by the second input address and the address of the second address storage unit.

13. The memory device of claim 11, wherein:
the first word line controller comprises a first address selection unit capable of selecting the first and second input addresses, selecting the address of the first address storage unit when the first additional active signal is activated and transferring the selected address to the first and second block row controllers; and
the second word line controller comprises a second address selection unit capable of selecting the first and second input addresses, selecting the address of the second address storage unit when the second additional active signal is activated and transferring the selected address to the third and fourth block row controllers.

14. A memory device, comprising:
a plurality of memory banks comprising a plurality of memory blocks which comprise a plurality of word lines;
a bank selection unit capable of selecting a memory bank, of the plurality of memory banks, corresponding to a bank address; and
a plurality of word line controllers capable of, when a corresponding memory bank among the plurality of memory banks is selected and an address of a first word line and an input address are different from each other, activating a first word line which is accessed during a previous write operation, among the plurality of word lines in the corresponding memory bank, while activating a second word line corresponding to the input address among the plurality of word lines, during a following active operation.

15. The memory device of claim 14, wherein the plurality of word line controllers store an address of the first word line during the previous write operation, and activates the first word line corresponding to a stored address in an activation section of the second word line.

16. The memory device of claim 14, wherein:
the plurality of word line controllers activates the first word line corresponding to a first input address in response to a first active command, and stores the first input address when a write command is applied; and
the plurality of word line controllers activates the first word line corresponding to a stored address and the second word line corresponding to a second input address when a second active command following the first active command is applied.

17. The memory device of claim 14, wherein the plurality of word line controllers inactivates the first word line during the active operation when the first and second word lines are included in a same memory block among the plurality of memory blocks of the corresponding memory bank.

18. The memory device of claim 14, wherein the plurality of memory banks comprise:
a local data bus capable of transferring data of a selected memory block of the plurality of memory blocks; and
a plurality of local switching units capable of connecting the local data bus and a corresponding memory block among the plurality of memory blocks when the corresponding memory block is selected.

19. The memory device of claim 14, wherein the plurality of word line controllers comprise:
an address storage unit capable of storing a first input address when the corresponding memory bank is selected and a write command is applied during a first active operation;
an additional active controller capable of activating an additional active signal after an active command is applied, when the corresponding memory bank is selected during a second active operation and mutually different memory blocks are selected by a second input address and an address of the address storage unit among the plurality of memory blocks of the corresponding memory bank; and
a plurality of block row controllers capable of activating a word line corresponding to the second input address when a corresponding memory block among the plurality of memory blocks of the corresponding memory bank is selected during the second active operation, and capable of activating a word line corresponding to the address of the address storage unit when the additional active signal is activated.

20. The memory device of claim 19, wherein the additional active controller inactivates the additional active signal when a same memory block is selected by the second input address and the address of the address storage unit among the plurality of memory blocks of the corresponding memory bank.

* * * * *